US009500686B1

(12) United States Patent
Wilson et al.

(10) Patent No.: US 9,500,686 B1
(45) Date of Patent: Nov. 22, 2016

(54) CAPACITANCE MEASUREMENT SYSTEM AND METHODS

(75) Inventors: Cole Wilson, Everett, WA (US); Thomas Middleton Rutledge Fuller, Seattle, WA (US); Mark Lee, Edmonds, WA (US); Louis Bokma, San Jose, CA (US); Andrew Best, Stanford, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 737 days.

(21) Appl. No.: 13/191,806

(22) Filed: Jul. 27, 2011

Related U.S. Application Data

(63) Continuation-in-part of application No. 12/861,812, filed on Aug. 23, 2010, now abandoned, and a continuation-in-part of application No. 11/823,982, filed on Jun. 29, 2007, now Pat. No. 7,804,307.

(51) Int. Cl.
 *G01R 27/26* (2006.01)
 *G01D 5/24* (2006.01)
 *G01R 31/28* (2006.01)

(52) U.S. Cl.
 CPC ......... *G01R 27/26* (2013.01); *G01R 27/2605* (2013.01); *G01D 5/24* (2013.01); *G01R 31/28* (2013.01)

(58) Field of Classification Search
 CPC  G01R 27/26; G01R 27/2605; G01R 31/028; G01D 5/24
 USPC .................................. 324/663; 345/173, 174
 See application file for complete search history.

(56) References Cited

U.S. PATENT DOCUMENTS

| 3,660,801 A * | 5/1972 | Paulfus .................. 439/419 |
| 3,921,167 A | 11/1975 | Fox |
| 3,979,745 A | 9/1976 | Bishop |
| 4,039,940 A | 8/1977 | Butler et al. |
| 4,103,252 A | 7/1978 | Bobick |
| 4,113,378 A | 9/1978 | Wirtz |
| 4,145,748 A | 3/1979 | Eichelberger et al. |
| 4,193,063 A | 3/1980 | Hitt et al. |
| 4,238,711 A | 12/1980 | Wallot |

(Continued)

FOREIGN PATENT DOCUMENTS

| EP | 0574213 A | 12/1993 |
| GB | 05000604 | 2/2005 |
| WO | 0002188 A | 1/2000 |

OTHER PUBLICATIONS

Microchip Technology Inc., Document No. DS31002A, © 1997 Microchip Technology, Inc., p. 2-13 (cited by Applicant; available at http://ww1.microchip.com/downloads/en/DeviceDoc/31002a.pdf; no unlocked version available).*

(Continued)

*Primary Examiner* — Benjamin M Baldridge

(57) ABSTRACT

A first capacitor and a second capacitor are charged until voltage at the second capacitor settles to a settling voltage. While charging, the first capacitor is alternately switched between a current source and ground. When the settling voltage is reached, charging of the first capacitor is halted. The second capacitor continues to be charged until voltage at the second capacitor reaches a reference voltage. The amount of time it takes for the settling voltage to reach the reference voltage corresponds to a measure of capacitance on the first capacitor.

26 Claims, 8 Drawing Sheets

(56) References Cited

U.S. PATENT DOCUMENTS

| | | |
|---|---|---|
| 4,264,903 A | 4/1981 | Bigelow |
| 4,266,144 A | 5/1981 | Bristol |
| 4,283,713 A | 8/1981 | Philipp |
| 4,292,604 A | 9/1981 | Embree et al. |
| 4,305,135 A | 12/1981 | Dahl et al. |
| 4,438,404 A | 3/1984 | Philipp |
| 4,475,151 A | 10/1984 | Philipp |
| 4,497,575 A | 2/1985 | Philipp |
| 4,558,274 A | 12/1985 | Carusillo |
| 4,560,830 A | 12/1985 | Perl |
| 4,586,260 A | 5/1986 | Baxter et al. |
| 4,614,937 A | 9/1986 | Poujois |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,508 A | 11/1989 | Andermo |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,755 A * | 6/1992 | Nootbaar et al. ............. 324/678 |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson, Jr. |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,373,245 A | 12/1994 | Vranish |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,408,194 A | 4/1995 | Steinbach et al. |
| 5,424,756 A | 6/1995 | Ho et al. |
| 5,461,321 A | 10/1995 | Sanders et al. |
| 5,479,103 A | 12/1995 | Kernahan et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | LeMoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,629,891 A | 5/1997 | LeMoncheck et al. |
| 5,648,642 A | 7/1997 | Miller et al. |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,691,513 A | 11/1997 | Yamamoto et al. |
| 5,730,165 A | 3/1998 | Philipp |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand |
| 5,801,340 A | 9/1998 | Peter |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,914,465 A | 6/1999 | Allen et al. |
| 5,914,708 A | 6/1999 | LaGrange et al. |
| 5,920,309 A | 7/1999 | Bisset et al. |
| 5,920,310 A | 7/1999 | Faggin et al. |
| 5,926,566 A | 7/1999 | Wang et al. |
| 5,942,733 A | 8/1999 | Allen et al. |
| 5,943,052 A | 8/1999 | Allen et al. |
| 5,949,264 A | 9/1999 | Lo |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,037,929 A | 3/2000 | Ogura et al. |
| 6,037,930 A | 3/2000 | Wolfe et al. |
| 6,060,957 A | 5/2000 | Kodrnja et al. |
| 6,067,019 A | 5/2000 | Scott |
| 6,097,432 A | 8/2000 | Mead et al. |
| 6,140,853 A | 10/2000 | Lo |
| 6,145,850 A | 11/2000 | Rehm |
| 6,148,104 A | 11/2000 | Wang et al. |
| 6,184,871 B1 | 2/2001 | Teres et al. |
| 6,185,450 B1 | 2/2001 | Seguine et al. |
| 6,188,228 B1 | 2/2001 | Philipp |
| 6,188,391 B1 | 2/2001 | Seely et al. |
| 6,191,723 B1 | 2/2001 | Lewis |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |
| 6,271,720 B1 | 8/2001 | Sevastopoulos |
| 6,271,835 B1 | 8/2001 | Hoeksma |
| 6,278,283 B1 | 8/2001 | Tsugai |
| 6,280,391 B1 | 8/2001 | Olson et al. |
| 6,288,707 B1 | 9/2001 | Philipp |
| 6,295,052 B1 | 9/2001 | Kato et al. |
| 6,304,014 B1 | 10/2001 | England et al. |

(56) References Cited

U.S. PATENT DOCUMENTS

| | | |
|---|---|---|
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,353,200 B1 | 3/2002 | Schwankhart |
| 6,353,337 B2 | 3/2002 | Nasu et al. |
| 6,366,099 B1 | 4/2002 | Reddi |
| 6,377,009 B1 | 4/2002 | Philipp |
| 6,377,129 B1 | 4/2002 | Rhee et al. |
| 6,380,929 B1 | 4/2002 | Platt |
| 6,380,931 B1 | 4/2002 | Gillespie et al. |
| 6,414,671 B1 | 7/2002 | Gillespie et al. |
| 6,424,338 B1 | 7/2002 | Anderson |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |
| 6,448,911 B1 | 9/2002 | Somayajula |
| 6,449,195 B1 | 9/2002 | Min et al. |
| 6,452,514 B1 | 9/2002 | Philipp |
| 6,457,355 B1 | 10/2002 | Philipp |
| 6,459,321 B1 | 10/2002 | Belch |
| 6,466,036 B1 | 10/2002 | Philipp |
| 6,473,069 B1 | 10/2002 | Gerpheide |
| 6,489,899 B1 | 12/2002 | Ely et al. |
| 6,490,203 B1 | 12/2002 | Tang |
| 6,498,720 B2 | 12/2002 | Glad |
| 6,499,359 B1 | 12/2002 | Washeleski et al. |
| 6,522,083 B1 | 2/2003 | Roach |
| 6,522,128 B1 | 2/2003 | Ely et al. |
| 6,522,187 B1 | 2/2003 | Sousa |
| 6,523,416 B2 | 2/2003 | Takagi et al. |
| 6,534,970 B1 | 3/2003 | Ely et al. |
| 6,535,200 B2 | 3/2003 | Philipp |
| 6,570,557 B1 | 5/2003 | Westerman et al. |
| 6,574,095 B2 | 6/2003 | Suzuki |
| 6,577,140 B1 | 6/2003 | Wenman |
| 6,583,632 B2 | 6/2003 | Von Basse et al. |
| 6,587,093 B1 | 7/2003 | Shaw et al. |
| 6,597,347 B1 | 7/2003 | Yasutake |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,642,857 B1 | 11/2003 | Schediwy et al. |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,690,066 B1 | 2/2004 | Lin et al. |
| 6,700,392 B2 | 3/2004 | Haase |
| 6,705,511 B1 | 3/2004 | Dames et al. |
| 6,714,817 B2 | 3/2004 | Daynes et al. |
| 6,720,777 B2 | 4/2004 | Wang |
| 6,730,863 B1 | 5/2004 | Gerpheide et al. |
| 6,731,121 B1 | 5/2004 | Hsu et al. |
| 6,744,258 B2 | 6/2004 | Ishio et al. |
| 6,750,852 B2 | 6/2004 | Gillespie et al. |
| 6,753,801 B2 * | 6/2004 | Rossi .................. 341/161 |
| 6,781,577 B2 | 8/2004 | Shigetaka |
| 6,788,221 B1 | 9/2004 | Ely et al. |
| 6,798,218 B2 | 9/2004 | Kasperkovitz |
| 6,806,693 B1 | 10/2004 | Bron |
| 6,809,275 B1 | 10/2004 | Cheng et al. |
| 6,810,442 B1 | 10/2004 | Lin et al. |
| 6,825,673 B1 | 11/2004 | Yamaoka |
| 6,838,887 B2 | 1/2005 | Denen et al. |
| 6,839,052 B1 | 1/2005 | Kramer |
| 6,856,433 B2 | 2/2005 | Hatano et al. |
| 6,859,159 B2 * | 2/2005 | Michalski .................. 341/172 |
| 6,861,961 B2 | 3/2005 | Sandbach et al. |
| 6,873,203 B1 | 3/2005 | Latham, II et al. |
| 6,879,215 B1 | 4/2005 | Roach |
| 6,882,338 B2 | 4/2005 | Flowers |
| 6,888,536 B2 | 5/2005 | Westerman et al. |
| 6,888,538 B2 | 5/2005 | Ely et al. |
| 6,891,531 B2 | 5/2005 | Lin |
| 6,893,724 B2 | 5/2005 | Lin et al. |
| 6,897,673 B2 | 5/2005 | Savage et al. |
| 6,914,547 B1 | 7/2005 | Swaroop et al. |
| 6,933,873 B1 | 8/2005 | Horsley et al. |
| 6,940,291 B1 | 9/2005 | Ozick |
| 6,946,853 B2 | 9/2005 | Gifford et al. |
| 6,949,937 B2 | 9/2005 | Knoedgen |
| 6,958,594 B2 | 10/2005 | Redl et al. |
| 6,969,978 B2 | 11/2005 | Dening |
| 6,970,120 B1 | 11/2005 | Bjornsen |
| 6,970,126 B1 | 11/2005 | McCartney et al. |
| 6,975,123 B1 | 12/2005 | Malang et al. |
| 6,993,607 B2 | 1/2006 | Philipp |
| 6,999,009 B2 | 2/2006 | Monney |
| 7,006,078 B2 | 2/2006 | Kim |
| 7,031,886 B1 | 4/2006 | Hargreaves |
| 7,032,051 B2 | 4/2006 | Reay et al. |
| 7,046,230 B2 | 5/2006 | Zadesky et al. |
| 7,068,039 B2 | 6/2006 | Parker |
| 7,075,316 B2 | 7/2006 | Umeda et al. |
| 7,078,916 B2 | 7/2006 | Denison |
| 7,098,675 B2 | 8/2006 | Inaba et al. |
| 7,109,978 B2 | 9/2006 | Gillespie et al. |
| 7,119,550 B2 | 10/2006 | Kitano et al. |
| 7,129,935 B2 | 10/2006 | Mackey |
| 7,148,704 B2 | 12/2006 | Philipp |
| 7,151,276 B2 | 12/2006 | Gerlach et al. |
| 7,158,056 B2 | 1/2007 | Wright et al. |
| 7,158,125 B2 | 1/2007 | Sinclair et al. |
| 7,205,777 B2 | 4/2007 | Schulz et al. |
| 7,235,983 B2 | 6/2007 | McCartney et al. |
| 7,245,131 B2 | 7/2007 | Kurachi et al. |
| 7,253,643 B1 | 8/2007 | Seguine |
| 7,262,609 B2 | 8/2007 | Reynolds |
| 7,271,608 B1 | 9/2007 | Vermeire et al. |
| 7,288,946 B2 | 10/2007 | Hargreaves et al. |
| 7,301,350 B2 | 11/2007 | Hargreaves et al. |
| 7,307,485 B1 | 12/2007 | Snyder et al. |
| 7,333,090 B2 | 2/2008 | Tanaka et al. |
| 7,339,580 B2 | 3/2008 | Westerman et al. |
| 7,359,816 B2 | 4/2008 | Kumar et al. |
| 7,375,535 B1 | 5/2008 | Kutz et al. |
| 7,378,810 B1 | 5/2008 | Sutardja et al. |
| 7,381,031 B2 | 6/2008 | Kawaguchi et al. |
| 7,392,431 B2 | 6/2008 | Swoboda |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,439,962 B2 | 10/2008 | Reynolds et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin, Jr. et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,521,941 B2 | 4/2009 | Ely et al. |
| 7,598,752 B2 | 10/2009 | Li |
| 7,598,822 B2 | 10/2009 | Rajagopal et al. |
| 7,663,607 B2 | 2/2010 | Hotelling et al. |
| 7,667,468 B1 | 2/2010 | Anderson |
| 7,683,641 B2 | 3/2010 | Hargreaves et al. |
| 7,804,307 B1 * | 9/2010 | Bokma et al. ................. 324/663 |
| 7,812,827 B2 | 10/2010 | Hotelling et al. |
| 7,831,070 B1 | 11/2010 | Cheng et al. |
| 8,040,142 B1 | 10/2011 | Bokma et al. |
| 8,068,097 B2 | 11/2011 | Guanghai |
| 8,082,566 B2 | 12/2011 | Stallings |
| 8,093,914 B2 | 1/2012 | Maharyta et al. |
| 8,144,125 B2 | 3/2012 | Peng et al. |
| 8,144,126 B2 | 3/2012 | Wright |

(56) References Cited

U.S. PATENT DOCUMENTS

| | | | |
|---|---|---|---|
| 8,169,238 B1 | 5/2012 | Maharyta et al. | |
| 8,248,084 B2 | 8/2012 | Bokma et al. | |
| 8,358,142 B2 | 1/2013 | Maharyta | |
| 2001/0048313 A1 | 12/2001 | Frank | |
| 2002/0000978 A1 | 1/2002 | Gerpheide | |
| 2002/0008543 A1* | 1/2002 | Nasu et al. | 326/83 |
| 2002/0063688 A1 | 5/2002 | Shaw et al. | |
| 2002/0080014 A1 | 6/2002 | McCarthy et al. | |
| 2002/0191029 A1 | 12/2002 | Gillespie et al. | |
| 2003/0025679 A1 | 2/2003 | Taylor et al. | |
| 2003/0062889 A1 | 4/2003 | Ely et al. | |
| 2003/0063428 A1 | 4/2003 | Nishi | |
| 2003/0080755 A1 | 5/2003 | Kobayashi | |
| 2003/0091220 A1 | 5/2003 | Sato et al. | |
| 2003/0112021 A1 | 6/2003 | Palata et al. | |
| 2003/0156098 A1 | 8/2003 | Shaw et al. | |
| 2003/0160808 A1 | 8/2003 | Foote et al. | |
| 2003/0183864 A1 | 10/2003 | Miyazawa | |
| 2003/0183884 A1 | 10/2003 | Miyazawa | |
| 2003/0184315 A1 | 10/2003 | Eberlein | |
| 2003/0189419 A1* | 10/2003 | Maki et al. | 320/166 |
| 2004/0041798 A1 | 3/2004 | Kim | |
| 2004/0056845 A1 | 3/2004 | Harkcom et al. | |
| 2004/0068409 A1 | 4/2004 | Tanaka et al. | |
| 2004/0169594 A1 | 9/2004 | Ely et al. | |
| 2004/0178989 A1 | 9/2004 | Shahoian et al. | |
| 2004/0178997 A1 | 9/2004 | Gillespie et al. | |
| 2004/0183560 A1* | 9/2004 | Savage et al. | 324/765 |
| 2004/0217945 A1 | 11/2004 | Miyamoto et al. | |
| 2004/0239616 A1 | 12/2004 | Collins | |
| 2004/0239650 A1 | 12/2004 | Mackey | |
| 2004/0252109 A1 | 12/2004 | Trent et al. | |
| 2004/0263864 A1 | 12/2004 | Lukacs et al. | |
| 2005/0021269 A1 | 1/2005 | Ely et al. | |
| 2005/0024341 A1 | 2/2005 | Gillespie et al. | |
| 2005/0031175 A1 | 2/2005 | Hara et al. | |
| 2005/0062732 A1 | 3/2005 | Sinclair et al. | |
| 2005/0073302 A1 | 4/2005 | Hibbs et al. | |
| 2005/0073322 A1 | 4/2005 | Hibbs et al. | |
| 2005/0083110 A1 | 4/2005 | Latham et al. | |
| 2005/0099188 A1* | 5/2005 | Baxter | 324/678 |
| 2005/0159126 A1 | 7/2005 | Wang | |
| 2005/0169768 A1 | 8/2005 | Kawaguchi et al. | |
| 2005/0270273 A1 | 12/2005 | Marten | |
| 2005/0275382 A1 | 12/2005 | Stessman et al. | |
| 2005/0280639 A1 | 12/2005 | Taylor et al. | |
| 2006/0022660 A1 | 2/2006 | Itoh | |
| 2006/0026535 A1 | 2/2006 | Hotelling et al. | |
| 2006/0032680 A1 | 2/2006 | Elias et al. | |
| 2006/0033508 A1 | 2/2006 | Lee | |
| 2006/0033724 A1 | 2/2006 | Chaudhri et al. | |
| 2006/0038793 A1 | 2/2006 | Philipp | |
| 2006/0049834 A1 | 3/2006 | Umeda | |
| 2006/0053387 A1 | 3/2006 | Ording | |
| 2006/0062889 A1 | 3/2006 | Houston et al. | |
| 2006/0066585 A1 | 3/2006 | Lin | |
| 2006/0097991 A1 | 5/2006 | Hotelling et al. | |
| 2006/0097992 A1 | 5/2006 | Gitzinger et al. | |
| 2006/0108349 A1 | 5/2006 | Finley et al. | |
| 2006/0113974 A1 | 6/2006 | Kan et al. | |
| 2006/0114247 A1 | 6/2006 | Brown | |
| 2006/0119331 A1* | 6/2006 | Jacobs et al. | 323/235 |
| 2006/0132111 A1* | 6/2006 | Jacobs et al. | 323/282 |
| 2006/0139469 A1 | 6/2006 | Yokota et al. | |
| 2006/0152739 A1 | 7/2006 | Silvestre | |
| 2006/0164142 A1 | 7/2006 | Stanley | |
| 2006/0172767 A1 | 8/2006 | Cathey et al. | |
| 2006/0176718 A1 | 8/2006 | Itoh | |
| 2006/0187214 A1 | 8/2006 | Gillespie et al. | |
| 2006/0193156 A1 | 8/2006 | Kaishita et al. | |
| 2006/0197750 A1 | 9/2006 | Kerr et al. | |
| 2006/0197752 A1 | 9/2006 | Hurst et al. | |
| 2006/0227117 A1 | 10/2006 | Proctor | |
| 2006/0232559 A1 | 10/2006 | Chien et al. | |
| 2006/0258390 A1 | 11/2006 | Cui et al. | |
| 2006/0262101 A1 | 11/2006 | Layton et al. | |
| 2006/0267953 A1 | 11/2006 | Peterson et al. | |
| 2006/0273804 A1 | 12/2006 | Delorme et al. | |
| 2006/0290678 A1 | 12/2006 | Lii | |
| 2007/0046299 A1* | 3/2007 | Hargreaves et al. | 324/678 |
| 2007/0069274 A1 | 3/2007 | Elsass et al. | |
| 2007/0074913 A1 | 4/2007 | Geaghan et al. | |
| 2007/0076897 A1 | 4/2007 | Philipp | |
| 2007/0100566 A1* | 5/2007 | Coley | 702/64 |
| 2007/0132737 A1 | 6/2007 | Mulligan et al. | |
| 2007/0152983 A1 | 7/2007 | Mckillop et al. | |
| 2007/0164756 A1 | 7/2007 | Lee | |
| 2007/0176609 A1 | 8/2007 | Ely et al. | |
| 2007/0176903 A1 | 8/2007 | Dahlin et al. | |
| 2007/0228256 A1 | 10/2007 | Mentzer et al. | |
| 2007/0229469 A1 | 10/2007 | Seguine | |
| 2007/0236478 A1 | 10/2007 | Geaghan et al. | |
| 2007/0257894 A1* | 11/2007 | Philipp | 345/173 |
| 2007/0263191 A1 | 11/2007 | Shibazaki | |
| 2007/0268243 A1 | 11/2007 | Choo et al. | |
| 2007/0268265 A1 | 11/2007 | Xiaoping | |
| 2007/0268273 A1 | 11/2007 | Westerman et al. | |
| 2007/0268274 A1 | 11/2007 | Westerman et al. | |
| 2007/0268275 A1 | 11/2007 | Westerman et al. | |
| 2007/0273659 A1 | 11/2007 | Xiaoping et al. | |
| 2007/0291013 A1 | 12/2007 | Won Jong | |
| 2007/0296709 A1 | 12/2007 | GuangHai | |
| 2008/0007529 A1 | 1/2008 | Paun et al. | |
| 2008/0007534 A1 | 1/2008 | Peng et al. | |
| 2008/0024455 A1 | 1/2008 | Lee et al. | |
| 2008/0036473 A1 | 2/2008 | Jansson | |
| 2008/0041639 A1 | 2/2008 | Westerman et al. | |
| 2008/0041640 A1 | 2/2008 | Gillespie et al. | |
| 2008/0042986 A1 | 2/2008 | Westerman et al. | |
| 2008/0042987 A1 | 2/2008 | Westerman et al. | |
| 2008/0042988 A1 | 2/2008 | Westerman et al. | |
| 2008/0042989 A1 | 2/2008 | Westerman et al. | |
| 2008/0042994 A1 | 2/2008 | Gillespie et al. | |
| 2008/0047764 A1 | 2/2008 | Lee et al. | |
| 2008/0048997 A1* | 2/2008 | Gillespie et al. | 345/174 |
| 2008/0062140 A1 | 3/2008 | Hotelling et al. | |
| 2008/0068100 A1 | 3/2008 | Goodnow et al. | |
| 2008/0088595 A1 | 4/2008 | Liu et al. | |
| 2008/0100280 A1* | 5/2008 | Masson et al. | 324/76.38 |
| 2008/0111714 A1 | 5/2008 | Kremin | |
| 2008/0116904 A1 | 5/2008 | Reynolds et al. | |
| 2008/0128182 A1 | 6/2008 | Westerman et al. | |
| 2008/0158178 A1 | 7/2008 | Hotelling et al. | |
| 2008/0179112 A1 | 7/2008 | Qin et al. | |
| 2008/0196945 A1 | 8/2008 | Konstas | |
| 2008/0250864 A1 | 10/2008 | Shipton | |
| 2008/0266263 A1 | 10/2008 | Motaparti et al. | |
| 2008/0278178 A1 | 11/2008 | Philipp | |
| 2009/0096758 A1 | 4/2009 | Hotelling et al. | |
| 2009/0322351 A1 | 12/2009 | McLeod | |
| 2010/0013791 A1 | 1/2010 | Haga et al. | |
| 2010/0328262 A1 | 12/2010 | Huang et al. | |
| 2011/0025629 A1 | 2/2011 | Grivna et al. | |
| 2011/0156724 A1 | 6/2011 | Bokma et al. | |
| 2011/0234523 A1 | 9/2011 | Chang et al. | |
| 2012/0043973 A1 | 2/2012 | Kremin | |
| 2013/0049771 A1 | 2/2013 | Peng et al. | |

OTHER PUBLICATIONS

Dennis Seguine, "Capacitive Switch Scan," Cypress Application Note AN2233a, Revision B, Apr. 14, 2005; 6 pages.

Seguine, Ryan, "Layout Guidelines for PSoC CapSense," Cypress Semiconductor Corporation, Application Note AN2292, pp. 1-10, Jul. 22, 2005.

USPTO Advisory Action for U.S. Appl. No. 11/230,719 dated Nov. 30, 2007; 3 pages.

USPTO Final Rejection for U.S. Appl. No. 11/230,719 dated Sep. 7, 2007; 9 pages.

USPTO Non-Final Rejection for U.S. Appl. No. 11/230,719 dated Jan. 16, 2007; 8 pages.

USPTO Non-Final Rejection for U.S. Appl. No. 11/230,719 dated May 11, 2006; 5 pages.

(56) References Cited

OTHER PUBLICATIONS

USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Notice of Allowance for U.S. Appl. No. 11/230,719 dated Jan. 16, 2008; 4 pages.
"The Virtual Keyboard: I-Tech Bluetooth/Serial Virtual Laser Keyboard Available Nowl" The Virtual Laser Keyboard (VKB) Online Worldwide Shop, <http://www.virtual-laser-keyboard.com>, downloaded Apr. 13, 2006; 4 pages.
Chapweske, Adam; "The PS/2 Mouse Interface," PS/2 Mouse Interfacing, 2001, retrieved on May 18, 2006; 10 pages.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)-Based Capacitive Touch Sensor Solution," Cypress Press Release; May 31, 2005; <http://www.cypress.com/portallserver>; retrieved on Feb. 5, 2007; 4 pages. Copyright 1995-2006 Cypress Semiconductor Corp.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages. Copyright 2006 Cypress Semiconductor Corp.
Cypress Semiconductor Corporation, "PSboC Mixed-Signal Controllers," Production Description; <http://www.cypress.com/portal/server>; retrieved on Sep. 27, 2005; 2 pages. copyright 1995-2005 Cypress Semiconductor Corp.
Cypress Semiconductor Corporation, "Release Notes srn017," Jan. 24, 2007; 3 pages.
Lee, Mark; "EMC Design Considerations for PSoC CapSense Applications," Cypress Semiconductor Corporation, Application Note AN2318; Sep. 16, 2005; 6 pages.
Mark Lee, "CapSense Best Practices," Cypress Application Note AN2394; Oct. 19, 2006; 10 pages.
Ryan Seguine et al., "Layout Guidelines for PSoC CapSense", Cypress Application Note AN2292, Revision B, Oct. 31, 2005, pp. 1-15.
Sedra, Adel S. et al., "Microelectronic Circuits," 3rd Edition, Oxford University Press, pp. xiii-xx and 861-883, 1991; 20 pages.
The Authoritative Dictionary of IEEE Standards Terms, 2000, IEEE Press Publications, 7th Edition, pp. 1133-1134; 4 pages.
USPTO Final Rejection for Application No. 111729,818 dated Jul. 2, 2009; 14 pages.
USPTO Final Rejection for U.S. Appl. No. 12/861,812 dated Oct. 18, 2011; 10 pages.
USPTO Non Final Rejection for U.S. Appl. No. 11/823,982 dated Mar. 19, 2009; 14 pages.
USPTO Non-Final Rejection for U.S. Appl. No. 11/729,818 dated Dec. 17, 2008; 12 pages.
USPTO Non-Final Rejection for U.S. Appl. No. 12/861,812 dated Apr. 15, 2011; 26 pages.
USPTO Notice of Allowance for U.S. Appl. No. 11/729,818 dated Nov. 13, 2009; 7 pages.
USPTO Notice of Allowance for U.S. Appl. No. 11/823,982 dated Oct. 6, 2009; 12 pages.
USPTO Notice of Allowance, U.S. Appl. No. 13/047,620, dated Apr. 11, 2012, 19 pages.
USPTO Restriction Requirement, U.S. Appl. No. 13/047,620, dated Feb. 27, 2012, 7 pages.
Van Ess, David; "Simulating a 555 Timer with PSoC," Cypress Semiconductor Corporation, Application Note AN2286, May 19, 2005; 10 pages.
Wikipedia, The Free Encyclopedia "IBM PC Keyboard" http://en.wikipedia.or/wiki/PC_keyboard>accessed May 19, 2006; 3 pages.
USPTO Final Rejection for U.S. Appl. No. 13/590,390 dated Jun. 23, 2015; 14 pages.
USPTO Non-Final Rejection for U.S. Appl. No. 13/590,390 dated Mar. 10, 2015; 14 pages.
USPTO Notice of Allowance for U.S. Appl. No. 13/590,390 dated Jun. 29, 2016; 5 pages.

\* cited by examiner

700

701

1000

1001

CAPACITANCE MEASUREMENT SYSTEM AND METHODS

RELATED APPLICATIONS

This application is a continuation-in-part of U.S. patent application Ser. No. 12/861,812, filed Aug. 23, 2010, which is a continuation-in-part of U.S. patent application Ser. No. 11/823,982, filed Jun. 29, 2007, now issued as U.S. Pat. No. 7,804,307.

FIELD

Embodiments of the present invention generally relate to capacitive sensors, and methods and systems that measure capacitance.

BACKGROUND

A capacitive sensor generally includes an electrode or an array of electrodes. When an object such as a finger or stylus is brought within range of an electrode, the capacitance of the electrode is changed by an amount that depends, at least in part, on the distance from the object to the electrode. For example, a set of electrodes may be arranged in parallel to define a sensing region, and the position of an object relative to the sensing region can be determined based upon the change in capacitance per electrode induced by the object. In simple terms, a profile of capacitance versus electrode can be used to unambiguously determine the position of an object in, for example, the x-direction—the x-coordinate corresponds to the peak of the profile. A second set of parallel electrodes arrayed perpendicular to the first set can be similarly used to determine the position of the object in the y-direction. A single electrode can be used to determine proximity (the z-direction).

Accurate measurements of capacitance changes induced by an object are needed so that the position of the object can be accurately determined. Accurate measurements of the background capacitance (e.g., the about of capacitance that is present even if an object is not in proximity) are also needed to account for noise that may be introduced by changes in ambient temperature or the presence of contaminants on the surface of the sensor, for example.

SUMMARY

Capacitive sensors should be noise resistant and should be able to achieve high resolution. Embodiments in accordance with the present invention provide these and other advantages.

In one embodiment, a current source charges a first capacitor (e.g., a senor capacitor) and a second capacitor (e.g., an internal capacitor) until voltages at the capacitors equilibrate at a settling voltage. In another embodiment, a third capacitor (e.g., a modification or external capacitor) is also charged until the voltages at each capacitor equilibrate at the settling voltage. In one embodiment, the first capacitor is alternately switched between the current source and ground until the settling voltage is reached. Sensitivity is proportional to signal-to-noise ratio (SNR). Switching of the first (e.g., sensor) capacitor reduces the outside noise sources on that capacitor that could inadvertently couple into the system.

When the settling voltage is reached, the first (sensor) capacitor is disconnected from the current source. The first capacitor can be switched to ground and disconnected from the second capacitor and optional third capacitor, so no coupled noise from the sensor affects the settled voltage. The current source will continue to charge the second capacitor until voltage at the second capacitor reaches a reference voltage (the third capacitor, if used, is similarly charged). The amount of time it takes for the settling voltage to reach the reference voltage corresponds to a measure of capacitance on the first capacitor. In one embodiment, a counter counts the number of cycles generated by an oscillator as the voltage increases from the settling voltage to the reference voltage.

In one embodiment, a comparator is used to compare the voltage at the capacitor(s) to the reference voltage. In one such embodiment, a low pass filter is coupled between the capacitor(s) and the comparator to reduce the effect of high frequency noise. In another such embodiment, the voltage is increased using a single slope analog-to-digital converter (ADC) that includes the current source, the counter and the comparator. The current source can be calibrated so that the settling voltage is just below the reference voltage, so that the count of oscillator cycles will have a larger dynamic range, increasing resolution.

In summary, high sensitivity and high resolution capacitance measurement systems and methods are described. The capacitance on the first capacitor can be accurately measured in the absence of an object to more precisely determined background capacitance. In the presence of an object, the change in capacitance on the first capacitor can be accurately measured, to detect the object with increased sensitivity and/or to more precisely locate the object relative to a sensing region. These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification, illustrate various embodiments of the present invention and, together with the description, serve to explain the principles of those embodiments.

DETAILED DESCRIPTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternates, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Figure 1:
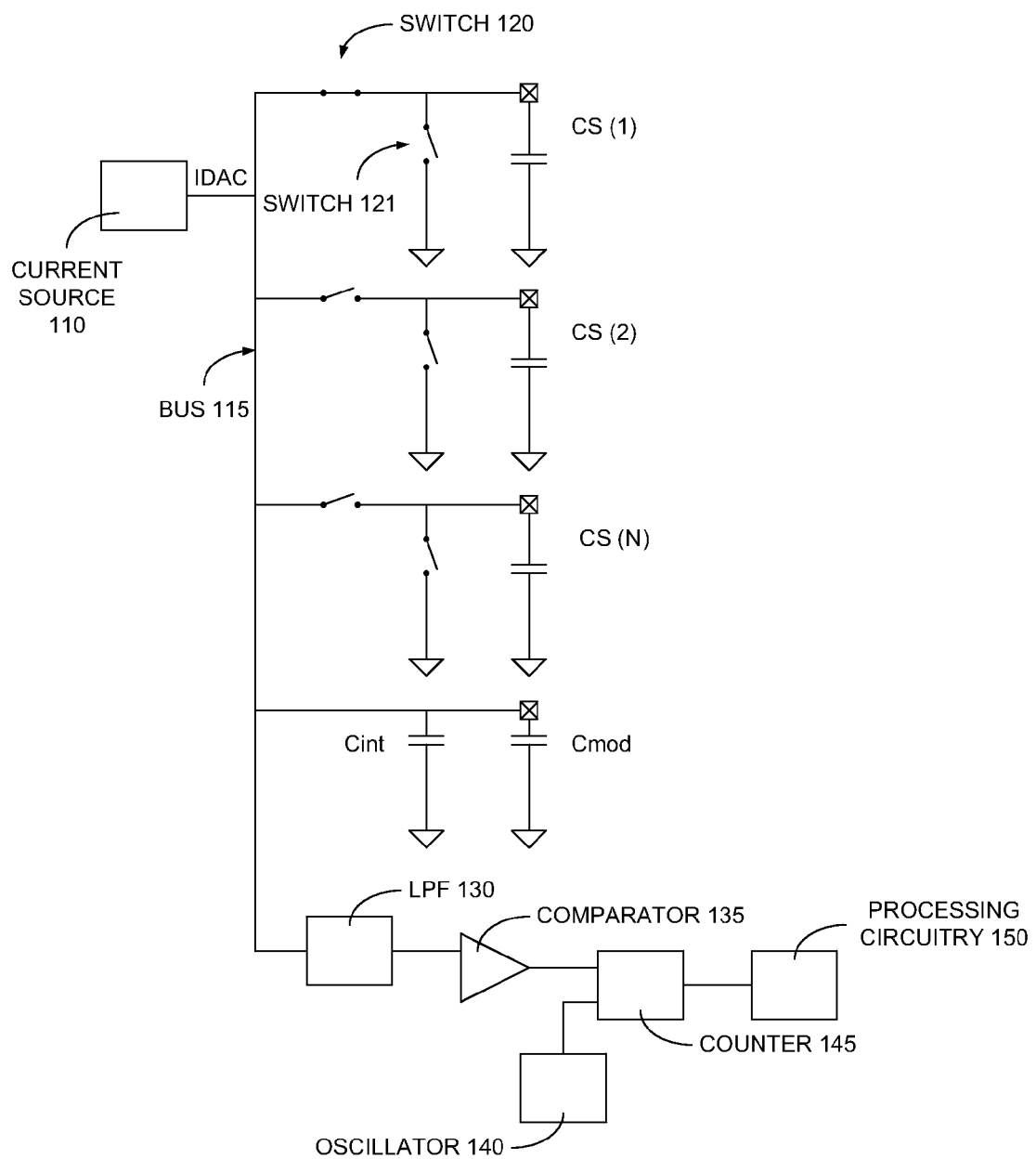
FIG. 1 illustrates one embodiment of a capacitance measuring system, with switches set in one position.

FIG. 1 illustrates one embodiment of a capacitance measuring system 100. In the example of FIG. 1, system 100 includes a number of capacitors Cs(1), Cs(2), . . . , Cs(N), which may be referred to as sensor capacitors or sensing capacitors, any one of which may also be referred to herein as a first capacitor. System 100 also includes a capacitor Cint, which may be referred to as a sampling capacitor or internal capacitor and which may also be referred to herein as a second capacitor. In one embodiment, system 100 also includes a capacitor Cmod, which may be referred to as a modification capacitor or external capacitor and which may also be referred to herein as a third capacitor. The capacitor Cint may be internal to a chip, and the capacitor Cmod may be external to the chip. The capacitor Cmod, though optional, can improve noise resistance and hence can increase sensitivity. The capacitor Cmod can also reduce or eliminate large voltage swings within the system.

The system 100 also includes a current source 110. IN one embodiment, current source 110 is an adjustable, digital current source that, once adjusted, supplies a constant charging current iDAC. The current source 110 is connected to the capacitors Cint and Cmod by a bus 115. In one embodiment, the bus 115 is an analog bus.

System 100 also includes switching circuitry that includes a number of switches such as switches 120 and 121. The current source 110 can be connected to the capacitors Cs(1), Cs(2), . . . , Cs(N), depending on the position of an intervening switch such as switch 120. The capacitors Cs(1), Cs(2), . . . , Cs(N) can also be connected to ground, depending on the position of an intervening switch such as switch 121. If, for example, capacitor Cs(1) is connected to ground by closing switch 121, then switch 120 is open so that capacitor Cs(1) is disconnected from the current source 110 (see FIG. 2). Conversely, if capacitor Cs(1) is connected to current source 110 by closing switch 120, then switch 121 is opened.

In the example of FIG. 1, system 100 also includes an optional low pass filter (LPF) 130, a comparator 135, an oscillator 140, a counter (or timer) 145, and processing circuitry 150 (e.g., a microprocessor). The low pass filter 130, if present, helps to prevent the input of high frequency noise to the comparator 135.

In operation, system 100 measures the capacitance on each of the sensor capacitors Cs(1), Cs(2), . . . , Cs(N). In the example of FIG. 1, capacitance is measured on one sensor capacitor at a time. In general, the capacitance on a selected capacitor (e.g., Cs(1)) is translated into an effective resistance by switching the capacitor Cs(1) between the bus 115 and ground (effective resistance is sometimes referred to as a capacitive reactance, measured in ohms). Switching of the capacitor Cs(1) reduces the outside noise sources on that capacitor that could inadvertently couple into the system 100. The current source 110 is used to create a voltage drop across the effective resistance. The voltage drop is sampled using the sampling capacitor Cint and measured using the current source 110, oscillator 140 and counter 145.

More specifically, in the first stage of operation, the selected capacitor (e.g., Cs(1)) is connected to bus 115 and current source 110 by closing switch 120 (switch 121 is open). Change flows into the capacitors Cs(1), Cint and Cmod from the current source 110. During the first stage, the capacitor Cs(1) is alternately switched between the bus 115 and ground by appropriately opening and closing the switches 120 and 121, until the settling voltage is reached. Each time the capacitor Cs(1) is switched between bus 115 and ground, an amount of charge is removed from the parallel capacitors Cint and Cmod. Charge from the capacitors Cint and Cmod can be transferred to Cs(1) until the voltage—referred to herein as the settling voltage—is the same at each of these capacitors.

In one embodiment, the capacitors Cint and Cmod are precharged to a preset voltage (e.g., the comparator 135 reference voltage Vref) using a voltage source (not shown). By starting at a preset voltage, the time needed to reach the settling voltage can be reduced.

As mentioned above, each time the capacitor Cs(1) is switched between bus 115 and ground, an amount of charge $Q_{sensor}$ is removed from the parallel capacitors Cint and Cmod:

$$Q_{sensor} = C_{sensor} V.$$

Over time, this charge movement acts like a current:

$$Q_{sensor}/t = C_{sensor} V/t.$$

The amount of current depends on the capacitance of sensor Cs(1) ($C_{sensor}$), the switching frequency f (the frequency at which the sensor capacitor Cs(1) is switched between bus 115 and ground), and the voltage:

$$I_{sensor} = f C_{sensor} V.$$

Solving for voltage:

$$V = \frac{I_{sensor}}{f C_{sensor}}.$$

The capacitance on Cs(1) can be thought of as a resistor based on Ohm's Law, resulting an effective resistance of:

$$R = 1/(f C_{sensor}).$$

The constant charging current iDAC flows through this effective resistance. The voltage across the effective resistance is the resulting voltage on the capacitors Cint and Cmod:

$$V = \frac{1}{fC_{sensor}}(iDAC).$$

Thus, the switching circuitry (e.g., switches 120 and 121) acts as a capacitance-to-voltage converter. Eventually, the charge will distribute (equilibrate) across the capacitors Cs(1), Cint and Cmod until the voltage is the same at each capacitor. The settling voltage is given by equation (1) and is based on the switching frequency f, the capacitance $C_{sensor}$ of Cs(1), and the amount of current iDAC. The capacitors Cint and Cmod act in effect as bypass capacitors that stabilize the resulting voltage.

Once the voltage settles to the settling voltage, the capacitor Cs(1) can be disconnected from current source 110. In addition, the capacitor Cs(1) can be switched to ground and disconnected from the capacitors Cint and Cmod (switch 121 is closed and switch 120 is opened; refer to FIG. 2), so that no coupled noise from the sensor affects the settled voltage. The settling voltage is held on the capacitors Cint and Cmod. The capacitor Cs(1) may remain connected to the capacitors Cint and Cmod, but better noise immunity is provided if it is disconnected.

Capacitance is measured in the second stage of operation. Once the capacitor Cs(1) is disconnected from current source 110 at the end of the first stage, the capacitors Cint and Cmod are charged by current source 110 until the voltage on those capacitors increases from the settling voltage to the threshold voltage (reference voltage Vref) of comparator 135. The amount of current supplied by the current source 110 in the second stage may be different from that of the first stage. A counter 145 counts the number of oscillator 140 cycles until the voltage reaches the reference voltage. The number of counts is related to the size of the capacitance Cint and Cmod:

$$\frac{\Delta V}{t} = \frac{iDAC}{C_{int} + C_{mod}}.$$

Solving for t:

$$t = \frac{(C_{int} + C_{mod})\Delta V}{iDAC}.$$

The above equation can be transformed to counts:

$$Counts = \frac{(C_{int} + C_{mod})\Delta V}{iDAC} f_0;$$

where $f_0$ is the clock or cycle frequency of the oscillator 140 (which may be different from the frequency f of equation (1) above).

The number of counts corresponds to the about of capacitance on the capacitors Cint and Cmod, and therefore also corresponds to the amount of capacitance that was on the sensor capacitor Cs(1) (before it was switched to ground at the end of the first stage). The number of counts increases when the sensor capacitance increases.

The first and second stages described above can be repeated to measure the capacitance on each of the other sensor capacitors Cs(2), . . . , Cs(N), and then repeated again starting with sensor capacitor Cs(1). Between measurement sequences, the current source 110 can be turned off, allowing the voltage on the capacitors Cint and Cmod to decrease; in one embodiment, the voltage decreases to the comparator reference voltage Vref. At the start of the next measurement sequence, the voltage will again be set to the settling voltage, as described above.

Capacitance measuring system 100 can be used as part of an interface (e.g., a touchpad or touchscreen) in an electronic device such as, but not limited to, a computing device (e.g., desktop, laptop, notebook), a handheld device (e.g., cell phone, smart phone, music player, game player, camera), or a peripheral device (e.g., keyboard). Capacitance measuring system 100 can be incorporated as part of a sensing system that can be used, for example, to determine whether or not an object (e.g., a user's finger, a probe, a stylus, etc.) is near or in contact with a sensing region. The sensor electrodes (specifically, the traces connecting the sensor capacitors to the rest of the system) may be made of any conductive material, including substantially transparent material such as indium tin oxide (ITO).

The capacitance measuring system described herein can also be sued to detect the presence of moisture, contaminants or the like on the surface of a sensing region. In general, capacitance measuring system 100 can be used to detect an element (e.g., an object or a substance) that is proximate to a sensing region. An element in contact with the sensing region is also proximate to that region, and locating the position of an element within the sensing region also includes detecting the element.

The presence of, for example, a finger in proximity to or in contact with the sensor capacitor Cs(1) will increase the capacitance on that sensor which, as shown by equation (1) above, will decrease the effective resistance of that capacitor. The lower effective resistance results in a lower settling voltage across the capacitors Cint and Cmod. Thus, it will take longer for the current source 110 to increase the voltage from the settling voltage to the reference voltage Vref, resulting in more counts relative to the number of counts that would be recorded in the absence of a finger.

Figure 2:
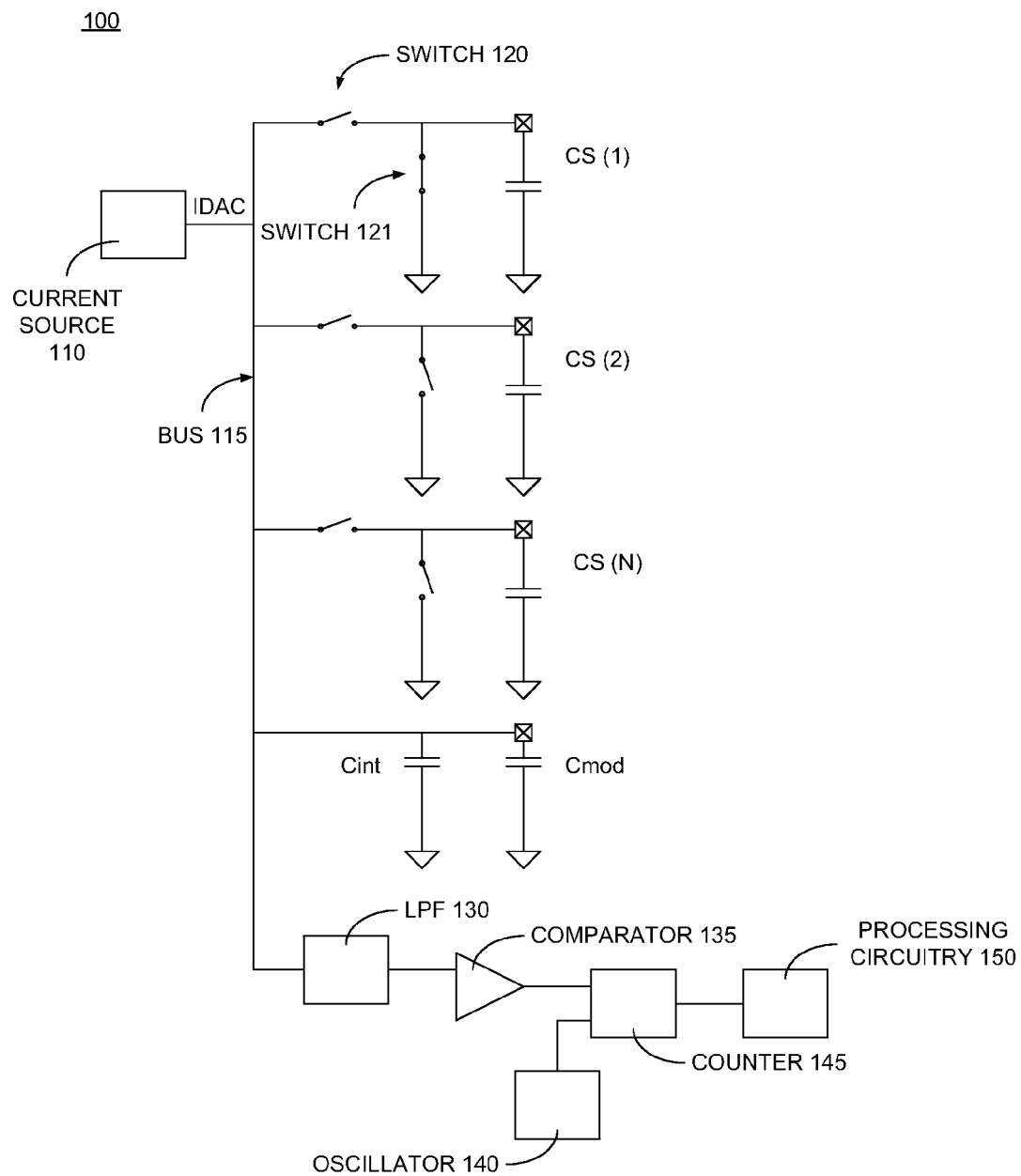
FIG. 2 illustrates one embodiment of a capacitance measuring system, with switches set in another position.
Figure 3:
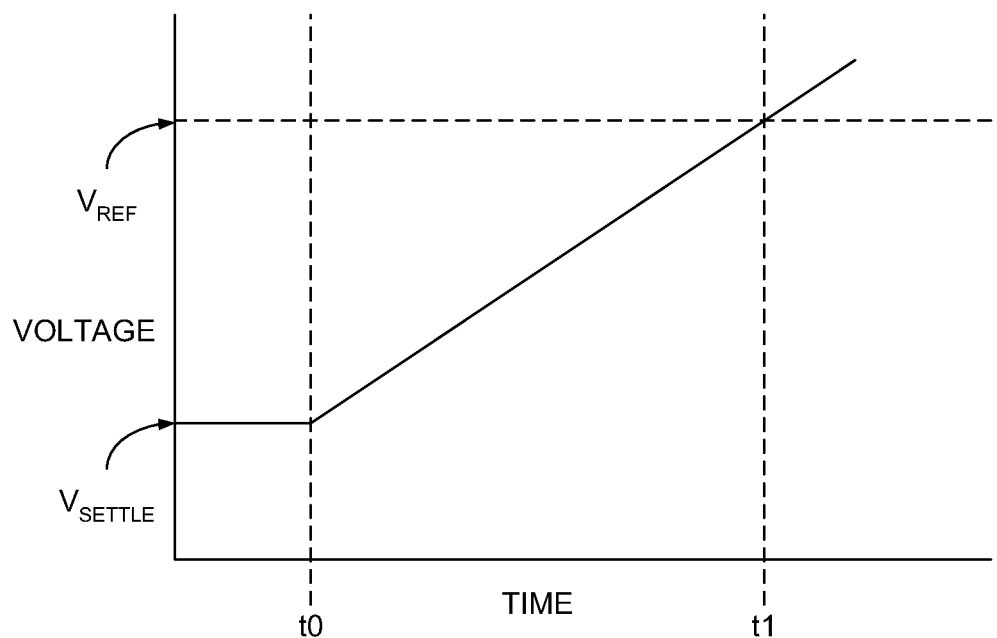
FIG. 3 illustrates voltage versus time in the presence of an object, as measured in a capacitance measuring system according to an embodiment of the present invention.

FIG. 3 illustrates voltage versus time in the presence of an object, as measured in capacitance measuring system 100 (FIG. 2) according to an embodiment of the present invention. Time t0 corresponds to the beginning of the second stage of operation mentioned above, and so the voltage held on the capacitors Cint and Cmod (and also on the bus 115) is the settling voltage. In the embodiment of FIG. 2, the voltage on the capacitors Cint and Cmod (and on the bus 115) is increased using a single slope ADC that includes the current source 110, the counter 145 and the comparator 135. Other types of ADCs (e.g., a multi-slope ADC) can be used instead of a single slope ADC. At time t1, the voltage reaches the threshold voltage (Vref) on the comparator 135. In the example of FIG. 2, the counter counts the number of cycles generated by oscillator 140 between time t0 and time t1.

Figure 4:
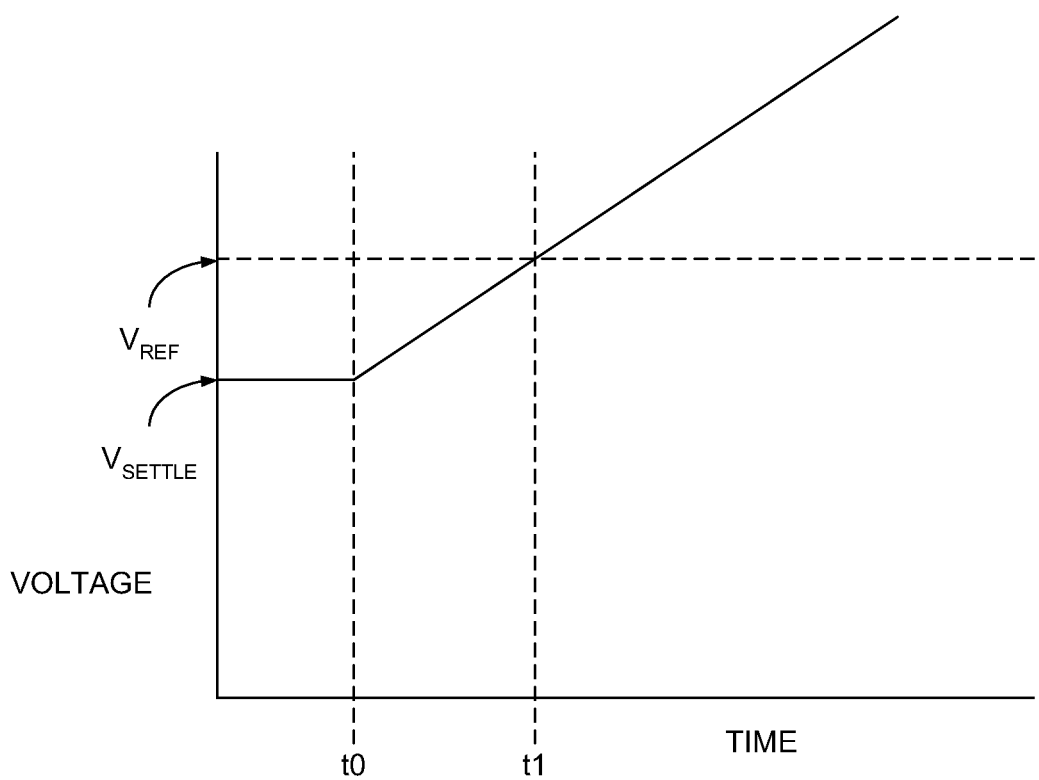
FIG. 4 illustrates voltage versus time in the absence of an object, as measured in a capacitance measuring system according to an embodiment of the present invention.

FIG. 4 illustrates voltage versus time in the absence of an object, as measured in a capacitance measuring system 100 (FIG. 2) according to an embodiment of the present invention. Relative to FIG. 3, the settling voltage is higher in the absence of an object. The voltage increases from the settling voltage to the threshold voltage at the same rate as in FIG. 3 but reaches the threshold voltage faster, resulting in fewer counts between time t0 and time t1 relative to FIG. 3.

To provide consistent sensitivity, the settling voltage is calibrated. The amount of current iDAC during the first operating stage (when the sensor capacitor is alternately switched between ground and the current source 110) determines the settling voltage. In one embodiment, at startup of the system 100 (in the absence of an object), a successive approximation technique is used to find a current iDAC that results in a settling voltage that is just below the threshold voltage Vref.

For example, the current source 110 may be controlled by an eight-bit signal. In successive approximation, the most significant bit is set and the resultant settling voltage is compared to the threshold voltage. Depending on the result of the comparison, the most significant bit either remains set or is cleared, and the next most significant bit is set. This process is repeated to determine the current iDAC that results in a settling voltage that is just below the threshold voltage Vref. As can be deduced from FIGS. 3 and 4, the dynamic range of the counts with an object present versus not present is greater as a result.

As mentioned above, the amount of current provided by current source 110 during the first stage of operation (during which the capacitors Cs(1), Cint and Cmod settle to the settling voltage) and during the second stage of operation (when the voltage on the capacitors Cint and Cmod is increased from the settling voltage to the threshold voltage) can be the same or different.

With reference again to FIG. 2, processing circuitry 150 can determine the presence of an object near a sensor capacitor Cs(1), Cs(2), ..., Cs(N) by comparing the most recent count for a capacitor to either the count recorded for that capacitor from the preceding measurement sequence or a stored baseline value. The object will be closest to the sensor capacitor that experiences the highest count. Movement of an object relative to the sensor capacitors can be detected by monitoring the count per sensor capacitor over time.

The stored baseline value will account for the presence of contaminants, for example, that may have accumulated on the surface of the sensor surface (e.g., on the surface of a touchpad). In general, the stored baseline value can account for effects that may affect the performance (accuracy) of system 100. The stored baseline value can be updated over time.

Figure 5:
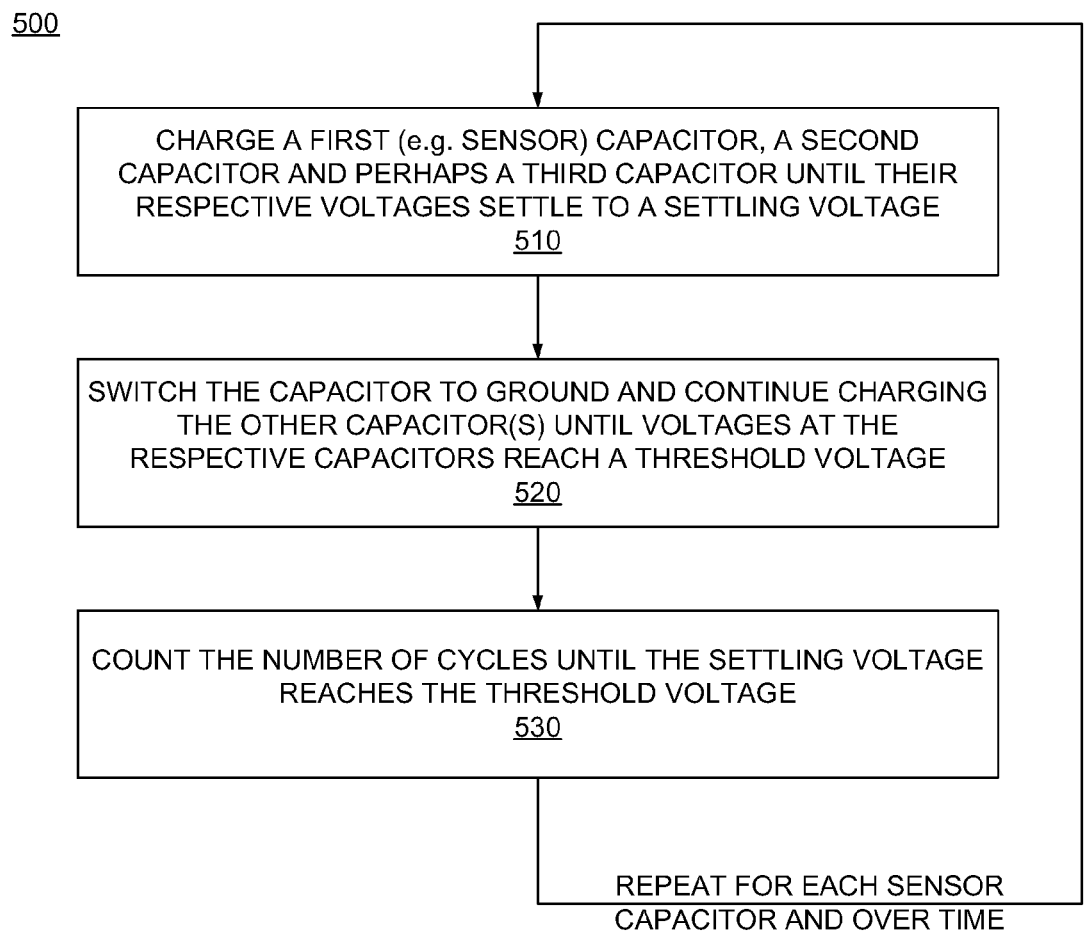
FIG. 5 is a flowchart of one embodiment of a method for measuring capacitance according to the present invention.

FIG. 5 is a flowchart 500 of one embodiment of a method for measuring capacitance according to the present invention. Although specific steps are disclosed in flowchart 500, such steps are exemplary. That is, embodiments of the present invention are well-suited to performing various other steps or variations of the steps recited in flowchart 500. The steps in flowchart 500 may be performed in any order different that presented and that the steps in flowchart 500 are not necessarily performed in the sequence illustrated. Furthermore, the features of the various embodiments described above can be used alone or in combination.

In block 510, with reference also to FIG. 1, a current source charges a first capacitor (e.g., sensor capacitor Cs(1)) and a second capacitor (e.g., capacitor Cint) until their respective voltages equilibrate at a settling voltage. In one embodiment, the first capacitor is switched back and forth between the current source and ground until the settling voltage is reached. In actuality, due to the switching of the first capacitor, there is charging by the current source and discharging from the first capacitor, but the net effect is charging. In one embodiment, the current source also charges a third capacitor (e.g., capacitor Cmod) until the voltages at each capacitor equilibrate at the settling voltage.

In block 520, when the settling voltage is reached, the first capacitor (Cs(1)) is disconnected from the current source. In one embodiment, the first capacitor (Cs(1)) is also switched to ground and disconnected from the capacitors Cint and Cmod. The current source continues to charge the second capacitor (Cint) and the optional third capacitor (Cmod) until voltages at the respective capacitors reach a reference voltage that is greater than the settling voltage.

In block 530, in one embodiment, oscillatory cycles are counted until the settling voltage reaches the reference voltage. In general, the amount of time it takes for the settling voltage reaches the reference voltage is determined.

Blocks 510, 520, and 530 can be repeated for each sensor capacitor Cs(1), Cs(2), ..., Cs(N). The count per sensor capacitor can be compared across the sensor to determine the position of an object, and the count per sensor can be compared to a preceding count to detect the presence of an object (or to determine that a previously detected object is no longer presence).

Figure 6:
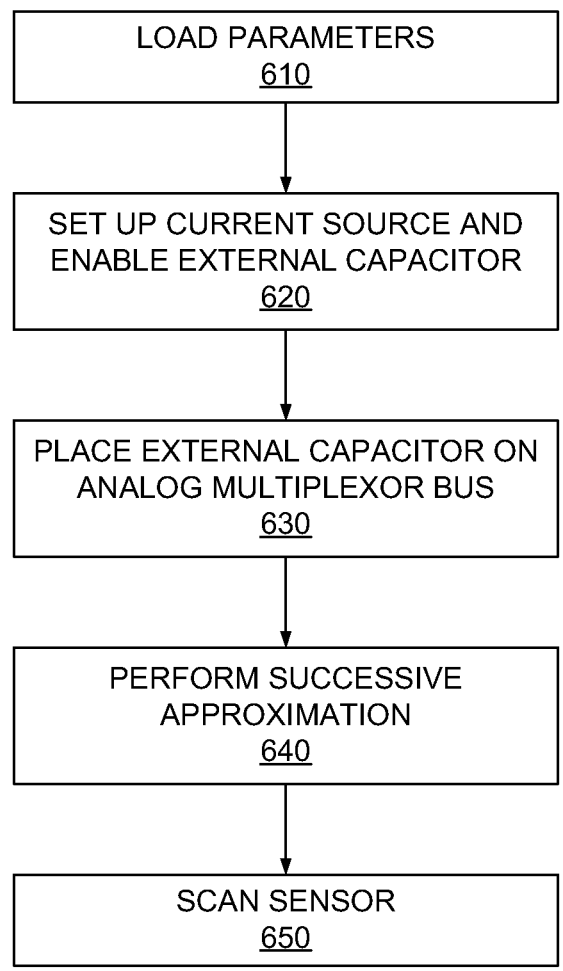
FIG. 6 illustrates a flowchart 600 for one embodiment of a method for setting up a capacitance measurement device according to the present invention

FIG. 6 is a flowchart 600 of one embodiment of a method for setting up a capacitance measurement device according to the present invention. In block 610, parameters that configure the capacitance measurement device are loaded. Such parameters may include the value for the programmable current source (110, FIG. 1), routing to the capacitance sensing input under test, oscillator speeds sources for the digital conversion (140, FIG. 140 and block 530, FIG. 5), and reference voltages for the comparator (135, FIG. 1). Parameters loaded in block 610 may include other adjustable or preset values or configurations used in the capacitance measurement device. Such parameters may be used to adjust the sensitivity, interconnect, timing or output of the capacitance sensing device.

In block 620, the current source (110, FIG. 1) is set up and an external capacitor is set up (Cmod, FIG. 1). The current source may set up using parameters of block 610 and is configured to charge the sensed capacitor (see FIG. 1) at a certain rate. The external capacitor may be used to filter the capacitance sensing and provide a more stable measurement. The enabling of the external capacitor may include writing to its register location to configure the external capacitor to a certain value. In one embodiment, the external capacitor may be integrated into the sensing integrated circuit. In this embodiment, there may be four or more capacitance settings. In another embodiment, the external capacitor may be external to the sensing integrated circuit. In this embodiment, enabling the external capacitor is accomplished by enabling the pin I/O to which it is coupled.

In block 630, the external capacitor is placed on a bus (115, FIG. 1). The external capacitor may be placed on the bus by closing a switch coupled to both the bus and to the external capacitor.

In block 640, the successive approximation routine is performed. Because the external capacitor is already coupled to the bus when the successive approximation of block 640 is executed, a possible overflow condition and subsequent recalibration caused by the addition of a larger capacitor on the sensing circuit after calibration is avoided, improving the efficiency of the capacitance measurement. The overflow condition is avoided because the actual scans of the sensor have the external capacitor coupled to the bus. Because the actual scans of the sensor have the external bus coupled to the bus, coupling the external capacitor to the bus during the successive approximation step provides a better calibration.

In block 650, the sensors are scanned. Sensors may be illustrated by Cs(1), . . . , Cs(N) of FIG. 1. The scanning of the sensors is illustrated in FIG. 5 and described above.

Figure 7A:
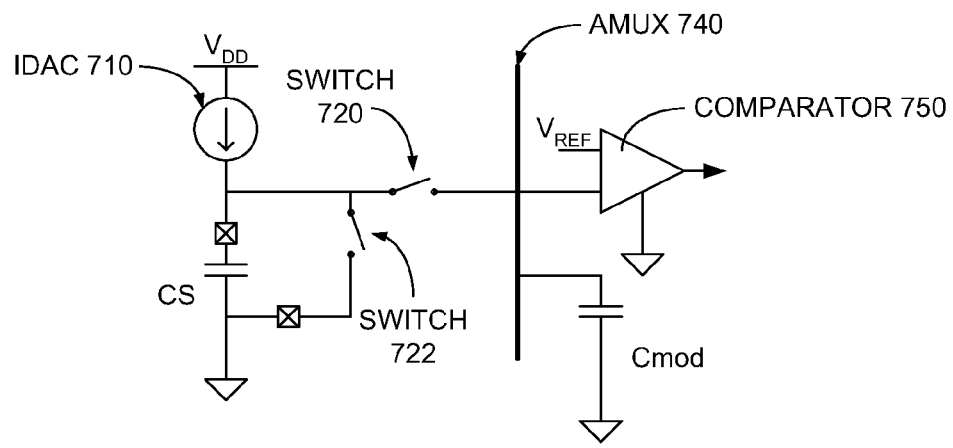
FIG. 7A illustrates an embodiment of a capacitance sensing front end 700 of system 100 (FIG. 1).

FIG. 7A illustrates one embodiment of a capacitance sensing front end 700 of system 100 (FIG. 1). Front end 700 may include a capacitor CS to me measured. Capacitor CS may have one electrode coupled to a ground potential. The other electrode of capacitor CD may be coupled to an programmable current DAC (IDAC) 710 which is configured to supply a current to the capacitor CS and sensing front end from a voltage potential, $V_{DD}$. The output of IDAC 710 and capacitor CS may be coupled alternately to an analog multiplexer bus (AMUX) 740 through switch 720 and to a ground potential through switch 722. Switch 720 may be used to couple capacitor 720 to the sensing circuitry, which is also coupled to AMUX 740. Switch 722 may be used to couple capacitor CS to ground, resetting the potential on capacitor CS. The sensing circuitry, including capacitor Cmod and comparator 750 may also be coupled to AMUX 740. In one embodiment, capacitor Cmod may have a capacitance to ground. Closing switch 720 couples capacitor CS to capacitor Cmod a comparator 750 through AMUX 740 for the scan described in FIG. 5.

Figure 7B:
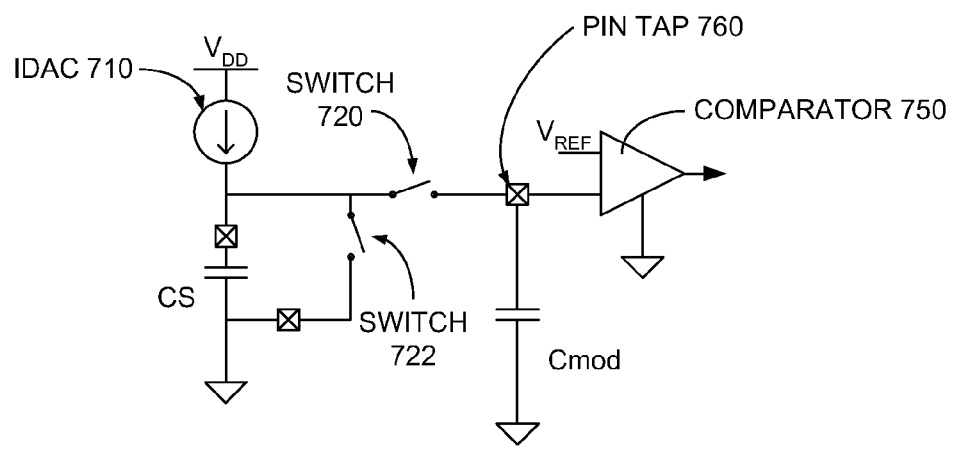
FIG. 7B illustrates an embodiment of a capacitance sensing front end 700 of system 100 (FIG. 1).

FIG. 7B illustrates another embodiment of a capacitance sensing front end 700 of system 100 (FIG. 1). In this embodiment the connection of Cmod to the input of comparator 750 and to switch 720 is through a pin tap 760. Direct coupling of the comparator 750 input, Cmod and switch 720 removes parasitic capacitance that is added by the AMUX (740, FIG. 7A) and reduces noise coupling into the input of comparator 750. Removal of AMUX-induces parasitic capacitance and the reduction of noise coupling into the input of comparator 750 improves performance of the capacitance sensing circuit by providing a cleaner measured signal to the counter and processing circuitry (145 and 150, FIG. 1). While this embodiment is shown with a pin tap 760, other embodiment may include a direct connection to an internal capacitor and Cmod. In such embodiments, a pin tap may not be necessary, but a direct connection to an internal capacitor provides the same benefits to the measurement system by removing parasitic capacitance and reducing the noise coupled into the measurement circuitry.

Figure 8:
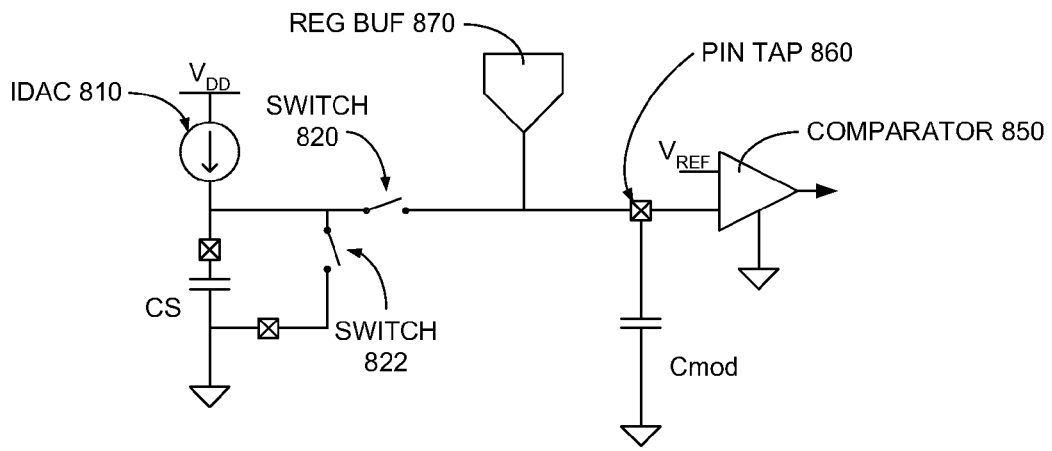
FIG. 8 illustrates an embodiment of a capacitance sensing front end 800 of system 100 (FIGS. 1 and 7).

FIG. 8 illustrates another embodiment of a capacitance sensing front end 800 of system 100 (FIGS. 1 and 7). In this embodiment, a register buffer (REG BUF) is coupled intermediate to switch 820 and pin tap 860 (analogous to switch 720 and pin tap 760, FIG. 7). In this embodiment, REG BUF 870 may be a programmable reference buffer. REG BUF 870 may be set to a number of reference voltages and use to charge the pin tap (or AMUX of FIG. 7A) to a reference voltage. In this embodiment the parasitic capacitance the capacitance sensing front end 800 and the pin tap 870 may be compensated for by rapidly charging the measurement circuit before beginning the actual scan.

Figure 9:
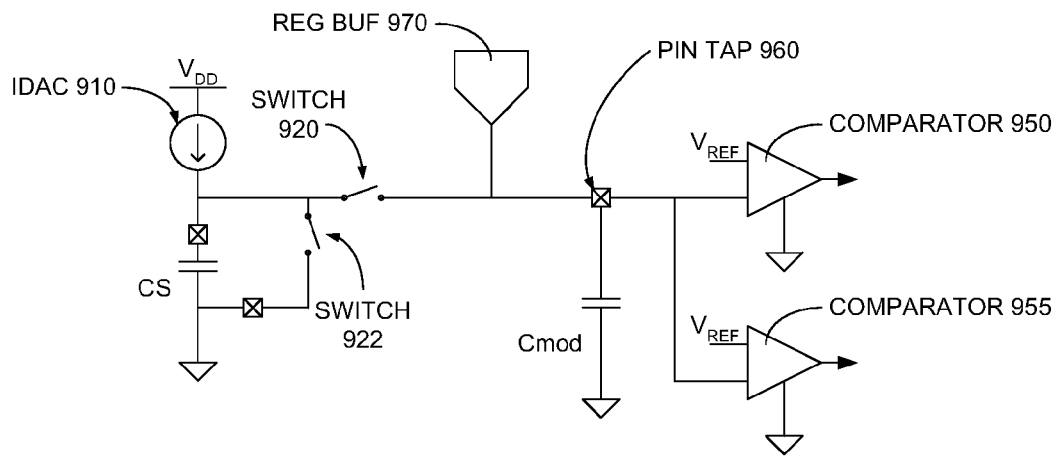
FIG. 9 illustrates another embodiment of a capacitance sensing front end 900 of system 100 (FIGS. 1 and 8).

FIG. 9 illustrates another embodiment of a capacitance sensing front end 900 of system 100 (FIGS. 1 and 8). In this embodiment, a second comparator 955 is coupled to pin tap 960 in parallel to comparator 950 (analogous to comparator 750, FIG. 7). In this embodiment comparators 950 and 955 may use different reference voltages VREF1 (comparator 950) and VREF2 (comparator 955). The use of two comparators allows for fast, hardware-based changes to sensitivity, which may improve performance and speed up dynamic sensing thresholds for applications with rapidly changing conditions.

Figure 10A:
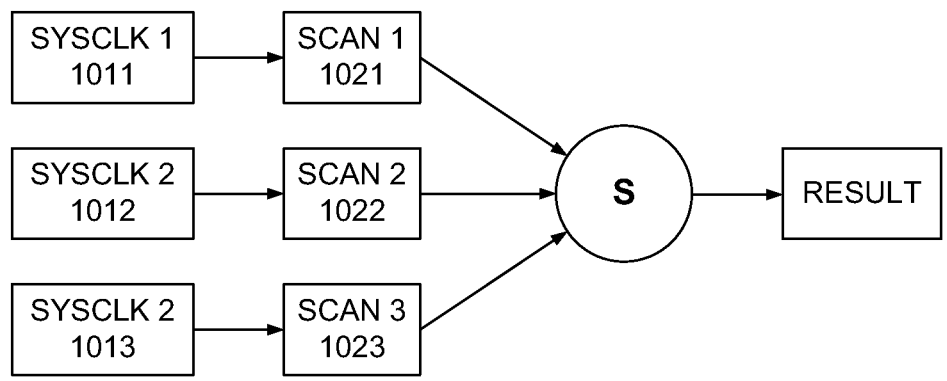
FIG. 10A illustrates an embodiment of a method for scanning a sensor or sensors including three clocks, or oscillators (SYSCLK).
Figure 10B:
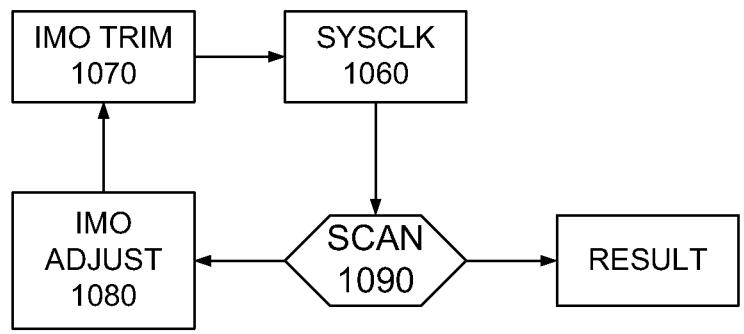
FIG. 10B illustrates an embodiment of a method for scanning capacitance sensors wherein an oscillator is adjusted in response to the scan outputs.

Capacitance sensing is sensitive to noisy environments. High-frequency noise sources may couple into the sensing circuitry in such a way that hardware improvements alone are not sufficient to buffer or block the signal. In such situations, it may be necessary to perform a second level of processing or control. FIGS. 10A and 10B illustrate two embodiments for improving the capacitance sensing performance by measuring or interacting with a noise source.

FIG. 10A illustrates a first embodiment, three clocks, or oscillators (SYSCLK), are used to scan the sensor(s). For scan 1 1021, SYSCLK 1 1011 is the oscillator frequency. The scan output of scan 1 1021 is stored in a memory location (not shown) and a second scan, scan 2 1022 is performed using a second oscillator frequency, SYSCLK 2 1012. The output of scan 2 1022 is stored in a memory location (not shown) and a third scan, scan 3 1023 is performed using a third oscillator frequency, SYSCLK 3 1013. The output of the scan 3 is stored in a memory location (not shown). All of the stored values are then processed together. If the aggregate of all of the scans, 1, 2 and 3, is such that a conductive object is present on the sensor, the capacitance sensing circuit outputs such a result. In one embodiment, the processing of the three scans may be by voting. In this embodiment, each scan has a discrete output, on or off. If there are more "ons" than "offs," a conductive object is determined to be present on the sensor.

While FIG. 10A illustrates an embodiment using three scans and three oscillator frequencies, one of ordinary skill in the art would understand that more or fewer scans and oscillator frequencies may be used. One of ordinary skill in the art would also understand that the number of oscillator frequencies may be fewer than the number of scans. That is, multiple scans may have the same oscillator frequencies. For such embodiments, the multiple scans may be used to remove low-frequency periodic noise from the capacitance sensing system.

FIG. 10B illustrates another embodiment of a method for scanning capacitance sensors where in the oscillator is adjusted in response to the scan outputs. In this embodiment, the output of the scan 1090 is a sensing result and a signal sent to IMO ADJUST 1080. IMO ADJUST 1080 may be used to change the internal main oscillator (IMO) frequency of the sensing device. The signal from scan 1090 may be a command to change the IMO or to keep it the same. Adjusting the IMO frequency may move the sensing circuit out of phase with possible noise sources. The output of IMO ADJUST 1080 is sent to IMO TRIM 1070, wherein the IMO frequency is trimmed for use by the capacitance sensing circuitry. The trimmed IMO frequency is then sent to SYSCLK 1060 and divided down and routed to the necessary circuit elements for performing a capacitance sensing scan. Once the scan is completed, the result may sent to the processing circuitry and again to IMO adjust 1080. The embodiment illustrated in FIG. 10B may allow for dynamic, real-time adjustment of capacitance sensing parameters in response to noise signals in the system. It also may improve the rate of scanning by not requiring multiple scans of each sensor at different frequencies to determine a result. One of ordinary skill in the art would understand that the methods illustrated by FIGS. 10A and 10B may be combined to achieve possible better noise performance still.

Embodiments of the present invention are thus described. While the present invention has been described in particular embodiments, it should be appreciated that the present invention should not be construed as limited by such embodiments, but rather construed according to the below claims.

What is claimed is:

1. A system for measuring capacitance comprising:
   a current source coupled to a first node of a first capacitor and to a first node of a second capacitor, the current source configured to supply charge to the first and second capacitors, wherein the charge supplied to the first and second capacitors generates a voltage potential across the first and second capacitors;
   a first switch configured to couple the current source and the first node of the first capacitor to the first node of the second capacitor;
   a second switch configured to couple the first node of the first capacitor to a second node of the second capacitor; and
   a circuit configured to measure the voltage potential across the first and second capacitors, wherein,
      the second capacitor is coupled to the measurement circuit after the current source is configured and coupled to the first node of the first capacitor and after a voltage potential across the first capacitor has reached a settling voltage, and
      the current source is configured to provide a charge on the first capacitor according to a predetermined charge rate.

2. The system of claim 1 wherein the first and second capacitors are coupled to the current source and to the voltage measurement circuit through a multiplexer bus.

3. The system of claim 1, wherein the second capacitor is coupled to the voltage measurement circuit and the current source through a pin tap.

4. The system of claim 1, wherein the voltage measurement circuit comprises a first comparator comprising a first input coupled to the first and second capacitors, a second input coupled to a first reference voltage, and an output coupled to a processing means.

5. The system of claim 4, wherein the voltage measurement circuit further comprises a second comparator comprising a first input coupled to the first and second capacitors, a second input coupled to a second reference voltage, and an output coupled to a processing means.

6. The system of claim 1 further comprising a reference buffered coupled intermediate to the current source and the second capacitor.

7. The system of claim 6, wherein the reference buffer is configured to charge the second capacitor at a rate substantially greater than the programmable current source.

8. The system of claim 1, wherein the first capacitor is a capacitance sensing input configured to have a variable capacitance in response to capacitance coupling to an activating element.

9. The system of claim 8, wherein the variable capacitance is capacitance between the first node of the first capacitor and a ground potential.

10. The system of claim 8, wherein the variable capacitance is a mutual capacitance between the first node of the first capacitor and a drive electrode, the drive electrode configured to provide a variable voltage signal.

11. A method for measuring a capacitive input comprising:
    configuring a current source to charge a first capacitor, wherein a first node of the first capacitor is the capacitive input and wherein the current source has an adjustable output;
    coupling the first capacitor and the current source to a multiplexer bus;
    coupling a second capacitor to the multiplexer bus;
    charging a first capacitor and a second capacitor until voltage at said second capacitor settles to a settling voltage derived from the current source, a settling time, and the capacitance of the first capacitor, wherein during said charging said first capacitor is switched back and forth between a current source and ground;
    when said settling voltage is reached, halting charging of said first capacitor while continuing to charge said second capacitor until voltage at said second capacitor reaches a reference voltage that is greater than said settling voltage; and
    determining a measure of time for said settling voltage to reach said reference voltage, wherein said measure of time corresponds to a measure of capacitance on said first capacitor.

12. The method of claim 11 further comprising:
    charging a third capacitor until voltages at said second and third capacitors settle to said settling voltage; and
    after said settling voltage is reached and said charging of said first capacitor is halted, continuing charging said third capacitor until voltage at said third capacitor reaches said reference voltage.

13. The method of claim 11 wherein said charging further comprises supplying a constant charging current to said first and second capacitors using a digital current source.

14. The method of claim 11 wherein said determining comprises counting a first number of oscillatory cycles until said settling voltage reaches said reference voltage, wherein said first number corresponds to said measure of capacitance on said first capacitor.

15. The method of claim 14 further comprising:
    halting charging of said second capacitor and reducing voltage at said second capacitor to less than said threshold voltage after voltage at said second capacitor reaches said threshold voltage;
    charging said first and second capacitors until voltage at said second capacitor settles to said settling voltage;
    halting charging of said first capacitor while continuing to charge said second capacitor until voltage at said second capacitor again reaches said reference voltage when said settling voltage is again reached; and
    counting a second number of oscillatory cycles until voltage at said second capacitor reaches said reference voltage.

16. The method of claim 15 further comprising comparing said first and second numbers to identify a change in said measure of capacitance on said first capacitor.

17. The method of claim 11 wherein said first capacitor is one of a plurality of capacitors, wherein said method further comprises measuring capacitance for each capacitor of said plurality of capacitors.

18. The method of claim 11 further comprising detecting an element in sensing range of at least one of said capacitors based on capacitances measured for said plurality of capacitors.

19. The method of claim 11 further comprising switching said first capacitor to ground and disconnecting said first capacitor from said second capacitor after said settling voltage is reached.

20. The method of claim 11 further comprising:
    comparing the measure of time to a reference measure of time;
    adjusting an output of an internal main oscillator in response to the comparison;
    adjusting at least one of a plurality of trim values for the internal main oscillator after adjusting the output of the internal main oscillator;

configuring an oscillator for the measuring of the capacitive input after adjusting the at least one the plurality of trim values; and repeating the measuring of the capacitive input.

21. An apparatus comprising a programmable current source coupled to a first variable capacitor and a switch network, the switch network configured to couple the programmable current source alternately to a ground potential and to a second capacitor and an input of a voltage measurement circuit, wherein the programmable current source is coupled to the second capacitor only after the voltage on the first variable capacitor and the second capacitor reaches a settling voltage.

22. The apparatus of claim 21 wherein the voltage measurement comprises a first comparator comprising a first input coupled to the first and second capacitors, a second input coupled to a first reference voltage, and an output coupled to a processing means.

23. The apparatus of claim 22 wherein the voltage measurement further comprises a second comparator comprising a first input coupled to the first and second capacitors, a second input coupled to a second reference voltage, and an output coupled to a processing means.

24. The apparatus of claim 21 further comprising a reference buffer coupled intermediate to the switch network and the second capacitor, wherein the reference buffer is configured to charge the second capacitor at a rate substantially greater than the programmable current source.

25. The system of claim 21, wherein the variable capacitor comprises a first node coupled to the measurement current source and a second node to a ground potential.

26. The system of claim 21, wherein the variable capacitor is a mutual capacitor between a first node of the variable capacitor and a drive electrode, the drive electrode configured to provide a variable voltage signal.

* * * * *